(12) United States Patent
Bertrand et al.

(10) Patent No.: US 6,627,504 B1
(45) Date of Patent: Sep. 30, 2003

(54) STACKED DOUBLE SIDEWALL SPACER OXIDE OVER NITRIDE

(75) Inventors: Jacques J. Bertrand, Capitola, CA (US); George J. Kluth, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 09/778,114

(22) Filed: Feb. 7, 2001

(51) Int. Cl.[7] ............................................. H01L 21/336
(52) U.S. Cl. ...................... 438/303; 438/267; 438/366; 438/649; 438/655; 438/664
(58) Field of Search ................................ 438/301, 303, 438/305, 306, 307, 649, 655, 267, 366, 583, 595, 664

(56) References Cited

U.S. PATENT DOCUMENTS

| | | | | | |
|---|---|---|---|---|---|
| 5,889,331 A | * | 3/1999 | Bai | .............................. | 257/768 |
| 5,923,986 A | * | 7/1999 | Shen | ........................... | 438/303 |
| 6,406,987 B1 | * | 6/2002 | Huang | ......................... | 438/595 |

* cited by examiner

Primary Examiner—Olik Chaudhuri
Assistant Examiner—Khiem Nguyen

(57) ABSTRACT

Bridging between nickel suicide layers on a gate electrode and source/drain regions along silicon nitride sidewall spacers is prevented by recessing the silicon nitride spacers and forming barrier spacers on top of the silicon nitride spacers. The barrier spacers prevent silicon migration and hence the formation of bridging silicide on the silicon nitride sidewall spacers.

10 Claims, 4 Drawing Sheets

STACKED DOUBLE SIDEWALL SPACER OXIDE OVER NITRIDE

FIELD OF THE INVENTION

The present invention relates to the fabrication of semiconductor devices, particularly to self-aligned silicide (salicide) technology, and the resulting semiconductor devices. The present invention is particularly applicable to ultra-large scale integrated circuit (ULSI) systems having features in the deep sub-micron regime.

BACKGROUND ART

As integrated circuit geometries continue to plunge into the deep sub-micron regime, it becomes increasingly more difficult to accurately form discrete devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the RxC product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon is directly on the gate oxide.

Various metal silicides have been employed in salicide technology, such as titanium, tungsten, and cobalt. Nickel, however, offers particular advantages vis-à-vis other metals in salicide technology. Nickel requires a lower thermal budget in that nickel silicide can be formed in a single heating step at a relatively low temperature of about 250° C. to about 600° C. with an attendant reduction in consumption of silicon in the substrate, thereby enabling the formation of ultra-shallow source/drain junctions.

In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p-type transistors. However, although silicon nitride spacers are advantageous from such processing standpoints, it was found extremely difficult to effect nickel silicidation of the gate electrode and source/drain regions without undesirable nickel silicide bridging and, hence, short circuiting, therebetween along the surface of the silicon nitride sidewall spacers.

SUMMARY OF THE INVENTION

There is a need for a method of manufacturing a semiconductor device having silicide contacts and gate electrode and associated source/drain regions without bridging therebetween along insulative sidewalls spacers, notably silicon nitride sidewall spacers.

These and other needs are met by embodiments of the present invention which provide a method of forming silicide on a semiconductor electrode device comprising the steps of forming on substrate a polysilicon gate electrode with sidewalls. Silicon nitride spacers are formed on the sidewalls and cover only a lower portion of the sidewalls. This leaves an upper portion of the sidewalls exposed. Barrier spacers are formed on the silicon nitride spacers and cover the upper portion of the sidewalls. A barrier spacers comprise silicon migration blocking material. A metal layer is formed over the gate electrode, the silicon nitride spacers, and the barrier spacers. Heating is then performed to react the metal layer with the gate electrode formed silicide. The barrier spacers substantially prevent silicon migration from the gate electrode during this heating step.

By providing barrier spacers that comprise silicon migration blocking material, silicide is prevented from forming on these silicon nitride spacers due to interaction of the metal with silicon that may otherwise migrate at the top of the nitride spacer. The prevention of silicide on the nitride spacers ensures that bridging does not occur between the gate electrode and silicide formed on active regions of the semiconductor device.

The earlier stated needs are also met by another embodiment of the present invention which provides a semiconductor device comprising a gate electrode which has opposing side surfaces and an upper surface. The gate electrode is provided on an upper surface of the semiconductor substrate with a gate insulating layer therebetween. Recessed silicon nitride spacers are provided on the opposing side surfaces and cover only a lower portion of these opposing side surfaces. On top of the silicon nitride spacers and on the opposing side surfaces are barrier spacers. These barrier spacers cover only an upper portion of the opposing side surfaces. A layer of silicide is provided on the upper surface of the gate electrode and another layer of silicide is provided on the substrate surface adjacent each silicon nitride sidewall spacer.

The semiconductor device of the present invention has a layer of silicide on the upper surface of gate electrode with a layer of silicide on the substrate surface, but these silicide layers are not connected by bridging silicide due to the barrier spacers provided on top of the silicon nitride spacers. The barrier spacers prevent formation of bridging silicide on the silicon nitride spacers, which may be caused by the migration of silicon at the top of the silicon nitride spacers in prior arrangements.

The foregoing and other features, aspects and advantages of the present invention will become more apparent from the following detailed description of the present invention when taken in conjunction with the accompanying drawings.

DESCRIPTION OF THE INVENTION

Figure 1:
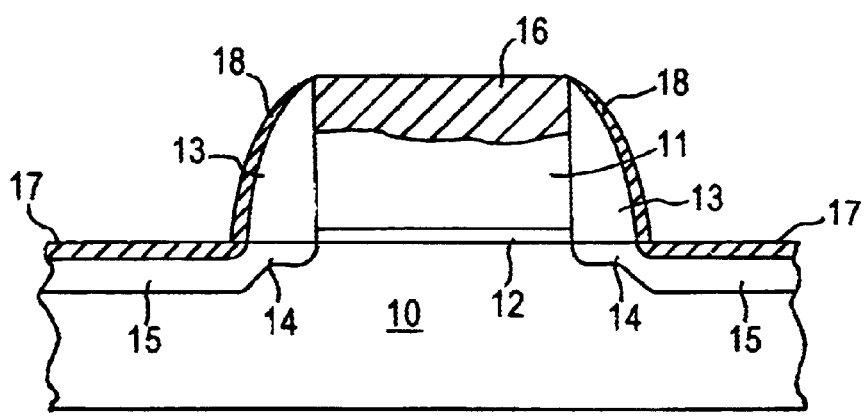
FIG. 1 schematically illustrates problematic nickel silicide bridging attendant upon conventional practices.

The present invention addresses and solves problems attendant upon implementing conventional salicide technology employing nickel as the metal for silicidation. As device geometries shrink into the deep sub-micron regime, nickel silicide bridging occurs along the surface of silicon nitride sidewall spacers between the nickel silicide layer on the gate electrode and nickel silicide layers on associated source/drain regions. For example, referring to FIG. 1, a gate electrode 11 is formed on substrate 10 with gate insulating layer 12 therebetween. Silicon nitride spacers 13 are formed on opposing side surfaces of gate electrode 11. Shallow source/drain extensions 14 and source/drain regions 15 are formed in substrate 10. A layer of nickel is deposited followed by heating to form a nickel silicide layer 16 on the upper surface of gate electrode 11 and a layer of nickel silicide 17 on associated source/drain regions 15. However, it was found that a thin layer of nickel silicide 18, typically at a thickness of about 30 Å to about 60 Å, is undesirably formed along the exposed surfaces of the silicon nitride sidewall spacers 13 causing bridging and hence, shorting between nickel silicide layer 16 and nickel silicide layers 17. It is postulated that the problem of nickel silicide formation 18 along the silicon nitride sidewall spacers 13 stemmed from the reaction of nickel with silicon that has migrated at the top of the silicon nitride sidewall spacers 13.

In accordance with embodiments of the present invention, the silicon nitride sidewall spacers are recessed so that they cover only a lower portion of the sidewalls, leaving an upper portion of the sidewalls exposed. The provided barrier spacers prevent silicon migration at the top of the silicon nitride spacers and thereby prevent silicide formation on the silicon nitride spacers. This ensures that bridging between the silicide formed on the gate electrode and the silicide formed at the source/drain regions are not bridged.

Figure 2:
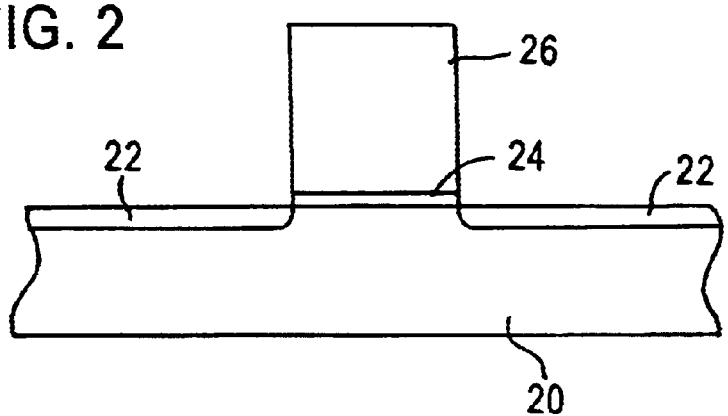
FIGS. 2–10 schematically illustrate sequential phases in accordance with an embodiment of the present invention, wherein like features are denoted by like reference numerals.

FIGS. 2–10 depict a sequence of steps performed in embodiments of the method of forming a semiconductor structure in accordance with the present invention. In FIG. 2, a semiconductor substrate 20, which can be n-type or p-type, is provided. Source/drain extensions 22 are provided in the substrate where these source/drain extensions 22 are created by the introduction of dopants into the silicon substrate 20. Introduction of the dopants may be by ion implantation, for example.

A gate insulating layer 24 is formed on the substrate 20. Gate insulating layer 24 is typically silicon dioxide and is formed by thermal oxidation or chemical vapor deposition (CVD).

A gate electrode 26 is formed on the gate dielectric layer 24. The gate electrode 26 is made of polycrystalline silicon, for example, and is formed from a layer of polycrystalline silicon that has been patterned and etched to form the structure depicted at in FIG. 2. The height of the gate electrode 26 may be approximately 1000 Å, for example, although greater or lesser heights may be employed.

Figure 3:
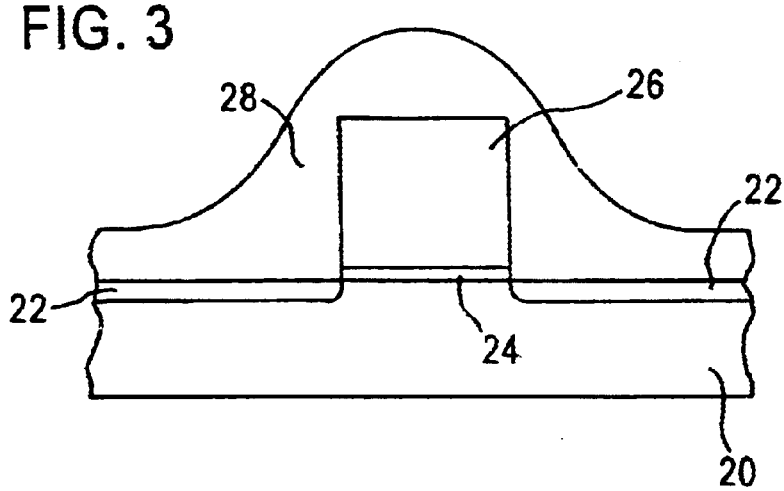

In FIG. 3, a layer of silicon nitride is deposited over the semiconductor structure FIG. 2, thus blanketing the substrate 20, the source/drain extensions 22 and the gate electrode 26. The deposition of silicon may be performed by any of number of different methods of deposition, such as chemical vapor deposition (CVD), plasma enhanced chemical vapor deposition (PECVD), etc. Silicon nitride layer 28 is deposited to a great enough depth to blanket deposit the semiconductor device. For example, the silicon nitride layer 28 can be formed by PECVD employing a silane flow rate of about 200 sccm, e.g., about 375 sccm, a nitrogen flow rate of about 2,000 to 4,000 sccm, e.g., about 2800 sccm, an ammonia flow rate of about 2,500 to about 4,000 sccm, e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C.

The silicon nitride layer 28 is now subjected to an etching that overetches the silicon nitride layer 28 to form recessed spacers 30 on the sidewalls of the gate electrode 26. The etchant is selective for silicon so that it will etch the silicon nitride and not etch the area of the exposed silicon, for example, the gate or the source/drain extensions 22. Such an etchant is, for example, $CHF_3/O_2$ using a plasma etcher. The etching proceeds in a substantially vertical direction and removes the silicon nitride layer 28 from the source/drain extension regions 22 and portions of the gate electrode 26, and leaves sidewall spacers 30. The highly selective etch is continued such that the silicon nitride spacers 30 are recessed. The etch rate characteristics and the height of gate electrode 26 determine the time parameters of this etching.

Figure 4:
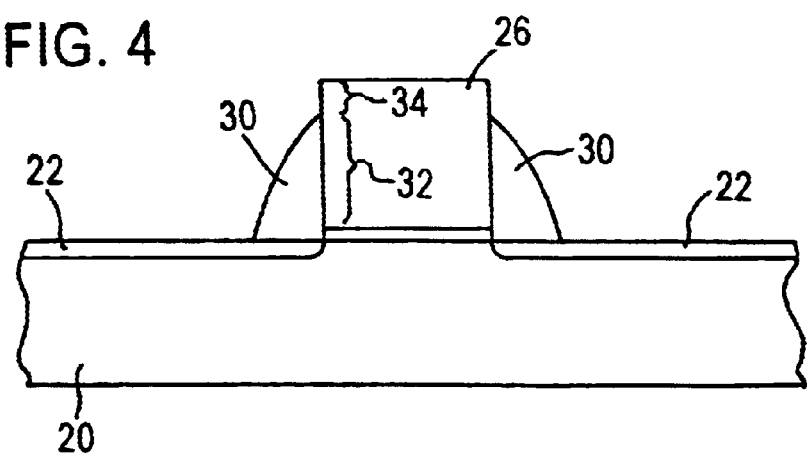

As can be appreciated from FIG. 4, only a lower portion 34 of the sidewalls of the gate electrode 26 are covered by the silicon nitride spacers 30. The upper portions 32 of the sidewalls of the gate electrode 26 are not covered by the silicon nitride spacers 30. In certain preferred embodiments, the height of the lower portion 34 is between about 500 to about 950 Å high, for example, when the overall height of the gate electrode 26 is about 1000 Å high. This leaves the remaining upper portion 32 to be between about 50 Å high to 500 Å high. In especially preferred embodiments, the upper portion 34 is between about 10 to about 50 Å high. Stated on a percentage basis, the lower portion 34 is between about 50% to about 98% of the total height of the sidewalls, with the especially preferred embodiment being between about 95% to 98% of the total height.

Figure 5:
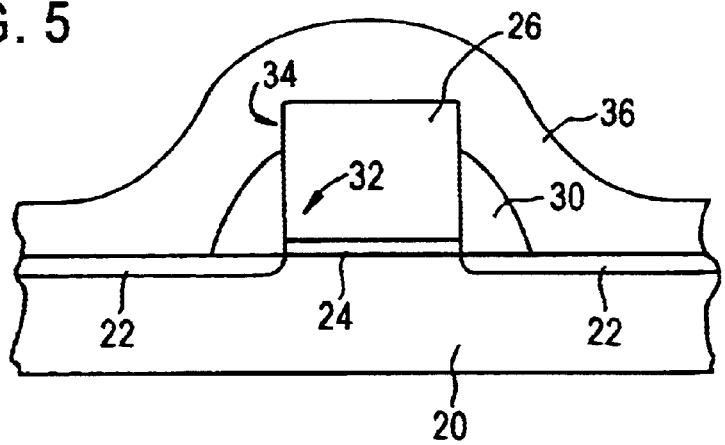

Following the formation of the recessed spacers 30, a layer of barrier space material 36 is deposited over the gate electrode 26, the silicon nitride spacers 30, and the source/drain extensions 22. The deposition may be by any suitable technique, such as Plasma Enhanced Chemical Vapor Deposition (PECVD). Such a PECVD deposition may involve using silane at a flow rate of about 50 to about 100 sccm, $N_2O$ at a flow rate of about 1,000 to about 4,000 sccm, a RF power of about 100 watts to about 300 watts, a pressure of about 2.4 Torr. to about 3.2 Torr, and temperature of about 380° C. to about 420° C., e.g., about 400° C. This produces a silicon oxide layer 36 that will act as a barrier material as will be described. The resulting structure is depicted in FIG. 5.

Figure 6:
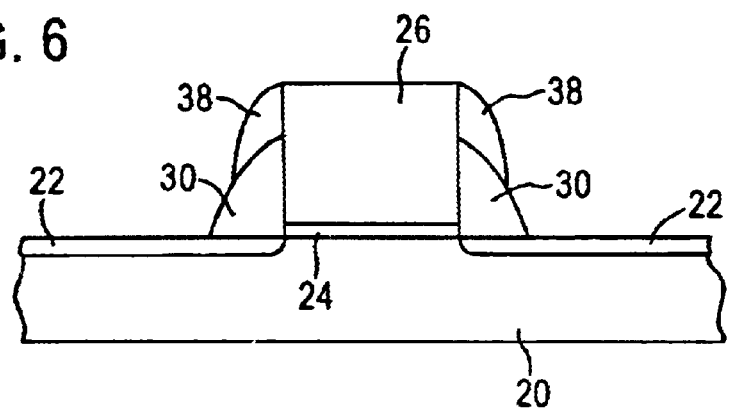

In FIG. 6, the oxide or other barrier material 36 has been etched to form barrier spacers 38 on the top of the silicon nitride spacers 30. The barrier spacers 38 also cover the exposed upper portion 32 of the sidewall of the gate electrode 26. The etching of the barrier material 36 may be by any suitable etch process. The barrier spacers 38 will thus be between approximately 500 to approximately 10 Å in height, depending upon the height of the previously exposed upper portion 32 of the sidewalls of the gate electrode 26. In especially preferred embodiments, the height of the barriers spacers 38 is between approximately 10 to 50 Å.

Following the formation of the barrier spacers 38, source/drain regions 40 are formed by introduction of a heavy dose of dopants into the substrate 20. The spacers 30, 38 prevent implantation into the substrate directly beneath the spacers 30, and thus preserve the relatively light doping in the source/drain extensions 22. This is depicted in FIG. 7.

Figure 7:
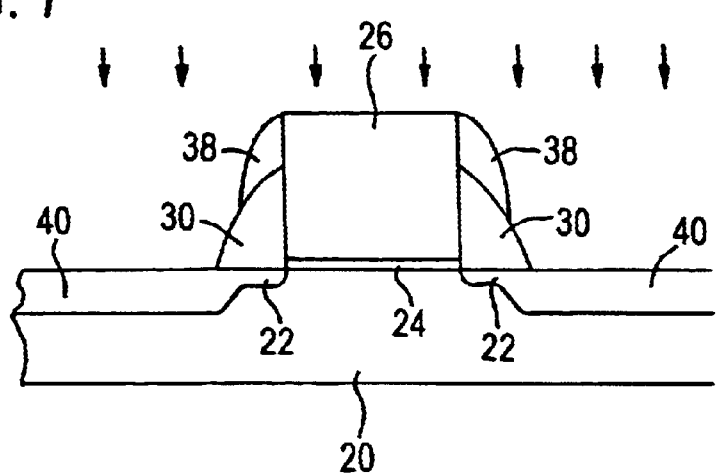
Figure 8:
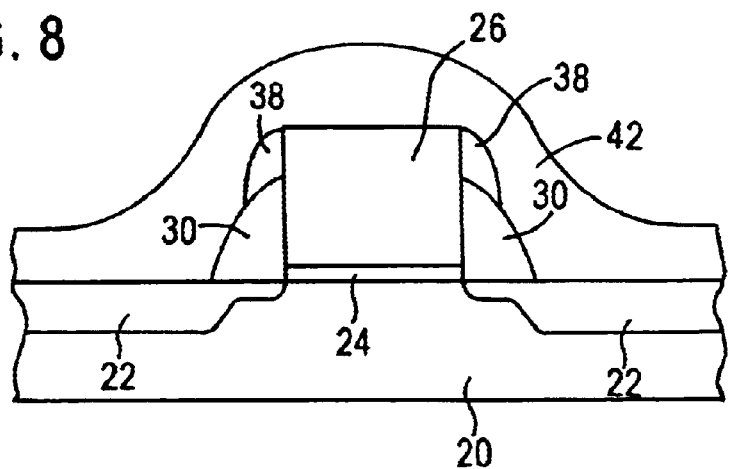

As shown in FIG. 8, a meter layer 42 is deposited over the structure of FIG. 7. In especially preferred embodiments, the metal in the metal layer 42 is nickel, although other metals that react with silicon to form silicide, such as titanium or cobalt, may employed.

Figure 9:
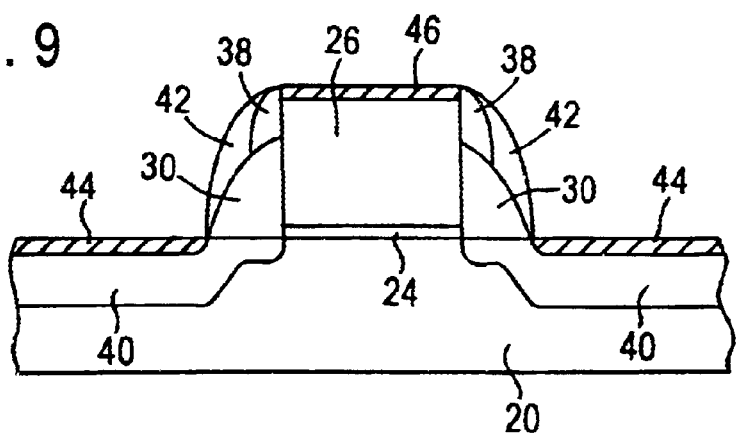
Figure 10:
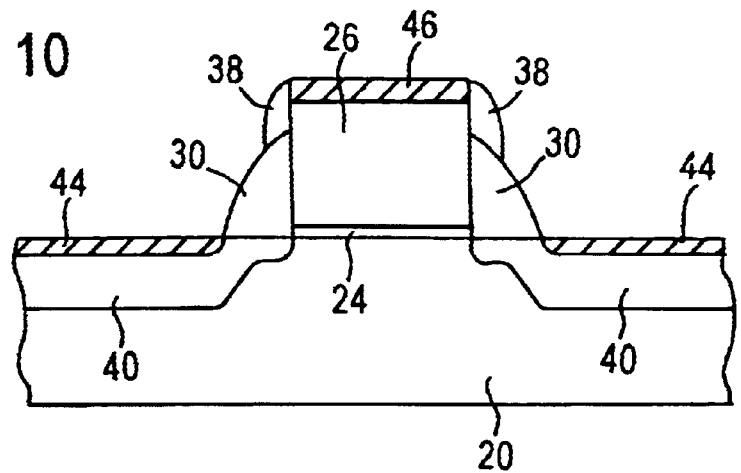

Following the deposition of the nickel, for example, a rapid thermal annealing is performed at a temperature between about 200° C. to about 600° C., e.g., about 400° C. to about 600° C. As depicted in FIG. 9, during such thermal treatment, a nickel silicide layer 46 is formed on the gate electrode 26 and the source/drain regions 40. Particularly noteworthy, however, is that the nickel silicide does not form on the silicon nitride sidewall spacers 30 and the barrier spacers 38. Hence, the metal 42 remains unreacted on the spacers 30, 38. The barrier spacers 38 act as a barrier to silicon migration at the top of the silicon nitride spacers 30. Since silicon is unavailable for reaction with the metal 42 at the silicon nitride spacers 30, silicide does not form on the spacers 38, 30 during the rapid thermal annealing treatment. Hence, the unreacted metal 42 may be removed from the surfaces of the silicon nitride sidewall spacers 30 and the barrier spacers 38 by a wet processing technique. For example, the wet processing technique may be treatment with a mixture of sulfuric acid and hydrogen peroxide with a ratio of sulfuric acid; hydrogen peroxide of about 1:12 to about 1:4, e.g., about 1.2. As seen in FIG. 10, this leaves a semiconductor structure that does not exhibit bridging silicide between the silicide area 46 on the top of the gate electrode 26 and the silicide regions 44 on the source/drain regions 40.

The present invention, therefore, enables the implementation of nickel salicide methodology, advantageously using silicon nitride sidewall spacers without bridging between the nickel silicide layer formed on the upper surface of the gate electrode and the nickel silicide formed on the associated source/drain regions. This is accomplished by providing barrier spacers on top of recessed silicon nitride spacers. The barrier spacers prevent the migration of silicon to the silicon nitride spacers, and thus prevent bridging from occurring on the surface of the silicon nitride spacers. The present invention is particularly applicable in manufacturing semiconductor devices with high circuit speeds having design features in the deep sub-micron regime.

Although the present invention has been described and illustrated in detail, it is to be clearly understood that the same is by way of illustration and example only and is not be taken by way of limitation, the scope of the present invention being limited only by the terms of the appended claims.

What is claimed is:

1. A method of forming silicide on a semiconductor device comprising:

forming on a substrate a polysilicon gate electrode with sidewalls, forming silicon nitride spacers on the substrate and covering only a lower portion of the sidewalls, thereby leaving an upper portion of the sidewalls exposed;

forming barrier spacers on the silicon nitride spacers and covering the upper portion of the sidewalls, the barrier spacers comprising silicon migration blocking material; and forming a metal layer over the gate electrode, the silicon nitride spacers, and the barrier spacers; and heating to react the metal layer with the gate electrode and form silicide, the barrier spacers substantially preventing silicon migration from the gate electrode.

2. The method of claim 1, wherein the barrier spacers comprise an oxide material.

3. The method of claim 2, wherein the step of forming silicon nitride spacers includes: depositing silicon nitride such that the silicon nitride covers the upper and lower portions, and overetching to expose the upper portion of the sidewalls.

4. The method of claim 3, wherein the step of forming barrier spacers includes depositing oxide over the gate electrode and the silicon nitride spacers, and etching the oxide until only a top of the silicon nitride spacers is covered by the oxide.

5. The method of claim 4, wherein the lower portion is between about 50% to about 98% of a total height of the sidewalls.

6. The method of claim 5, wherein the sidewalls are about 800 to about 2000 Å high.

7. The method of claim 4, wherein the upper portion is between about 10 to about 100 Å high.

8. The method of claim 4, wherein the upper portion is between about 10 to about 50 Å high.

9. The method of claim 8, wherein the silicide is nickel silicide.

10. The method of claim 4, wherein the silicide is nickel silicide.

* * * * *